(12) United States Patent
Lee

(10) Patent No.: US 9,792,966 B2
(45) Date of Patent: Oct. 17, 2017

(54) PAGE BUFFER AND SEMICONDUCTOR MEMORY DEVICE INCLUDING THE SAME

(71) Applicant: SK hynix Inc., Gyeonggi-do (KR)

(72) Inventor: Yeonghun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 18 days.

(21) Appl. No.: 15/068,394

(22) Filed: Mar. 11, 2016

(65) Prior Publication Data

US 2017/0117025 A1    Apr. 27, 2017

(30) Foreign Application Priority Data

Oct. 27, 2015    (KR) .................. 10-2015-0149473

(51) Int. Cl.
*G11C 7/12*    (2006.01)
*G11C 7/10*    (2006.01)

(52) U.S. Cl.
CPC . *G11C 7/12* (2013.01); *G11C 7/10* (2013.01)

(58) Field of Classification Search
CPC .................................. G11C 7/12; G11C 7/10
USPC .................................................. 365/189.05
See application file for complete search history.

(56) References Cited

U.S. PATENT DOCUMENTS

| 5,936,890 A * | 8/1999 | Yeom ..................... G11C 16/10 365/185.12 |
| 6,850,438 B2 * | 2/2005 | Lee ..................... G11C 16/0408 257/E21.69 |
| 2003/0189853 A1 * | 10/2003 | Tanizaki ................ G11C 7/062 365/200 |
| 2010/0329005 A1 * | 12/2010 | Yang ................... G11C 11/5628 365/185.03 |
| 2011/0280067 A1 * | 11/2011 | Kim .................... G11C 11/5628 365/185.2 |
| 2011/0310666 A1 * | 12/2011 | Miida ..................... G11C 16/10 365/185.11 |
| 2012/0026797 A1 * | 2/2012 | Kim ................... G11C 16/0483 365/185.18 |
| 2014/0361233 A1 * | 12/2014 | Kim .................. H01L 29/66666 257/2 |

FOREIGN PATENT DOCUMENTS

KR    1020020049195    6/2002
KR    1020110078730    7/2011

\* cited by examiner

*Primary Examiner* — Huan Hoang
*Assistant Examiner* — Muna A Techane
(74) *Attorney, Agent, or Firm* — IP & T Group LLP

(57) ABSTRACT

A semiconductor memory device may include a memory cell array including a plurality of memory cells, and a plurality of page buffers respectively coupled to a plurality of bit lines of the memory cell array, the page buffers being supplied with internal voltages to precharge the plurality of bit lines or to sense an amount of current flowing through the plurality of bit lines, during a sensing operation, wherein each of the page buffers converts the internal voltages into supply voltages having constant potential levels.

10 Claims, 6 Drawing Sheets

US 9,792,966 B2

PAGE BUFFER AND SEMICONDUCTOR MEMORY DEVICE INCLUDING THE SAME

CROSS-REFERENCE TO RELATED APPLICATION

The present application claims priority to Korean patent application number 10-2015-0149473 filed on Oct. 27, 2015, the entire disclosure of which is incorporated herein in its entirety by reference.

BACKGROUND

Field of Invention

Various embodiments of the present disclosure relate to electronic devices and more particularly, to a page buffer and a memory device including the page buffer.

Description of Related Art

Semiconductor memory devices are generally classified into volatile and nonvolatile memory devices.

Nonvolatile memory devices have relatively low write and read speeds, but preserve stored data even if their power supply is turned off or interrupted. Examples of nonvolatile memory devices include read only memory (ROM), mask ROM (MROM), programmable ROM (PROM), erasable programmable ROM (EPROM), electrically erasable programmable ROM (EEPROM), flash memory, phase change random access memory (PRAM), magnetoresistive RAM (MRAM) resistive RAM (RRAM), ferroelectric RAM (FRAM) devices and the like. Flash memories may be divided into NOR and NAND type.

A flash memory has the advantage of freely programming and erasing data (i.e., the advantage of RAM) and preserving stored data even when power supply may be turned off or interrupted (i.e., the advantage of ROM). Flash memories are widely used as storage media for portable electronic devices, such as digital cameras, personal digital assistants (PDAs), and MP3 players.

SUMMARY

Various embodiments of the present disclosure are directed to a page buffer and a semiconductor memory device including the page buffer. The page buffer provides improved, more stable operation during operation of the semiconductor memory device.

One embodiment of the present disclosure provides a semiconductor memory device, including a memory cell array including a plurality of memory cells, and a plurality of page buffers respectively coupled to a plurality of bit lines of the memory cell array, the page buffers being supplied with internal voltages to precharge the plurality of bit lines or to sense an amount of current flowing through the plurality of bit lines, during a sensing operation, wherein each of the page buffers converts the internal voltages into supply voltages having constant potential levels.

Another embodiment of the present disclosure provides a page buffer, including a bit line coupling unit coupled between a bit line to which a plurality of memory cells may be coupled and a control node and suitable for electrically coupling the bit line to the control node in response to a bit line coupling signal, a clamp circuit supplied with a first internal voltage to precharge the bit line and a sensing node, and suitable for adjusting a potential level of the sensing node depending on an amount of current of the bit line, a current determinations circuit supplied with a second internal voltage and suitable for adjusting an amount of output current in response to the potential level of the sensing node in the clamp circuit, and a latch circuit suitable for storing data corresponding to the amount of current adjusted by the current determination circuit, wherein the current determination circuit may generate a supply voltage by regulating the second internal voltage to a constant potential level.

A further embodiment of the present disclosure provides a page buffer, including a bit line coupling unit coupled between a bit line to which a plurality of memory cells may be coupled and a controls node, and suitable for electrically coupling the bit line to the control node in response to a bit line coupling signal, a clamp circuit supplied with an internal voltage to precharge the bit line and a sensing node, and suitable for adjusting a potential level of the sensing node depending on an amount of current of the bit line, a current determination circuit suitable for adjusting an amount of output current in response to the potential level of the sensing node in the clamp circuit, and a latch circuit suitable for storing data corresponding to the amount of current adjusted by the current determination circuit, herein the clamp circuit may generate a supply voltage by regulating the internal voltage to a constant potential level.

BRIEF DESCRIPTION OF THE DRAWINGS

Hereinafter, Example embodiments will be described more fully with reference to the accompanying drawings. However, it is noted that the present disclosure may be embodied in different forms and should not be construed as being limited to the embodiments set forth herein. Rather, these embodiments are provided so that this disclosure will be thorough and complete to those skilled in the art.

In the drawings, dimensions may be exaggerated for clarity of illustration. Also, it will be understood that when an element is referred to as being "between" two elements, it can be the only element between the two elements, or one or more intervening elements may also be present. Like reference numerals refer to like elements throughout.

DETAILED DESCRIPTION

Advantages and features of the present invention, and methods for achieving the same will be provided with reference to described embodiments together with the accompanying drawings. However, the present disclosure is not limited to the described embodiments and may be implemented in various ways. Rather, these embodiments are provided so that this disclosure will be thorough and complete to those skilled in the art.

In the entire specification, if certain parts are described as being coupled to other parts, they are not only directly coupled to the other parts, but also indirectly coupled to the other parts with any other device interposed therebetween. In the entire specification, the terms "comprising" or "including" a component, are inclusive and do not exclude additional, unrecited elements or method steps.

Figure 1:
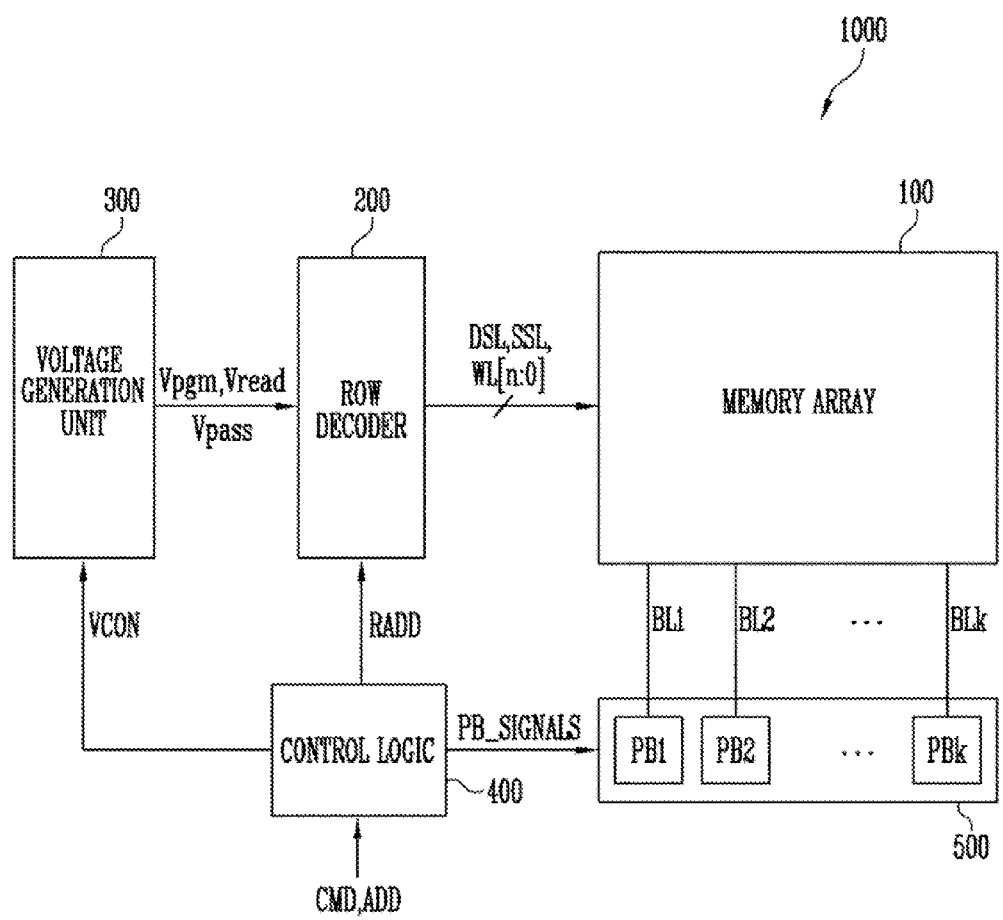
FIG. 1 is a diagram illustrating a semiconductor memory device, according to an embodiment of the present disclosure.

Referring now to FIG. 1 a semiconductor memory device 1000, according to an embodiment of the present disclosure, may include a memory cell array 100, a row decoder 200, a voltage generation unit 300, control logic 400, and a page buffer group 500.

The memory cell array 100 may be any suitable memory cell array. For example, the memory cell array 100 may include a plurality of memory cells arranged in memory blocks (nor shown). Each of the memory blocks may include a plurality of strings coupled between bit lines and a common source line. That is, the strings may be respectively coupled to corresponding bit lines. The strings may also be coupled in common to the common source line. Each of the strings may include a source select transistor, a plurality of memory cells, and a drain select transistor, coupled in series to each other.

The row decoder 200 may output operating voltages Vpgm, Vread, and Vpass, outputted from the voltage generation unit 300, to the local lines DSL, WL0 to WLn, and SSL of the memory cell array 100, response to row address signals RADD outputted from the control logic 400.

The voltage generation unit 300 may generate and output the operating voltages Vpgm, Vread, and Vpass used for the overall operation of memory cells in response to a voltage control signal VCON outputted from the control logic 400.

The control logic 400 controls the row decoder 200, the voltage generation unit 300, and the page buffer group 500 so as to perform a program operation, a verify operation, a read operation or an erase operation in response to a command signal CMD that is externally inputted through an input/output (I/O) circuit (not shown). For example, the control logic 400 may generate and output the voltage control signal VCON so that the voltage generation unit 300 may generate the operating voltages Vpgm, Vread, and Vpass in response to the command signal CMD. Further, the control logic 400 may output the row address signals RADD required to control the row decoder 200 in response to an address signal ADD that is externally inputted through the I/O circuit. Further, the control logic 400 may output page buffer control signals PB_SIGNALS required to control the page buffer group 500 in response to the command signal CMD.

The page buffer group 500 may be coupled to the memory cell array 100 through a plurality of bit lines BL1 to BLk. The page buffer group 500 may include a plurality of page buffers PB1 to PBk, each page buffer being coupled to the memory cell array through a bit line. For example, page buffers PB1 to PBK may be coupled to the memory cell array through corresponding bit lines BL1 to BLK, respectively. The plurality of page buffers PB1 to PBk may be operated in response to the page buffer control signals PB_SIGNALS outputted from the control logic 400. For example, during a program operation, the plurality of page buffers PB1 to PBk may store program data that are externally inputted temporarily, and then adjust the potential levels of the corresponding bit lines BL1 to BLk depending on the temporarily stored data. During a read operation, the plurality of page buffers PB1 to PBk may sense the potential levels or the amount of current of the corresponding bit lines BL1 to BLk, generate read data, and then output the read data to a device external to the semiconductor memory device 1000.

Figure 2:
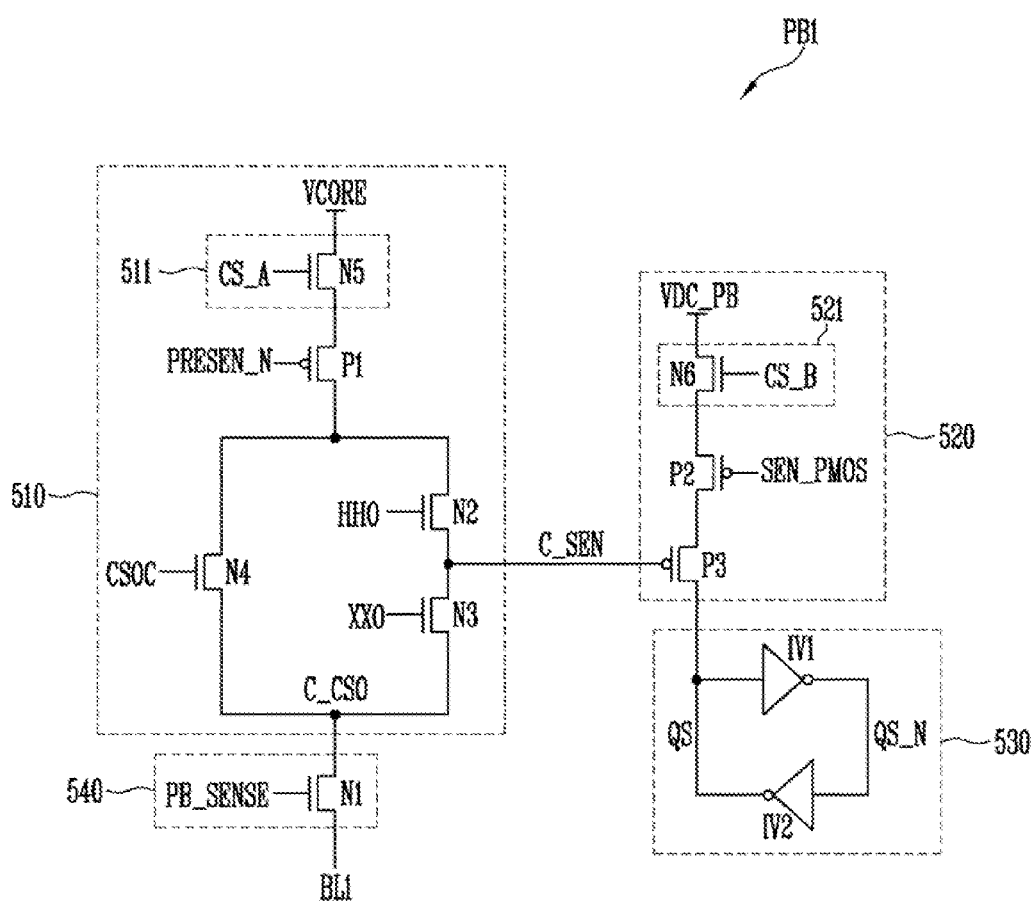
FIG. 2 is a diagram illustrating a pager buffer, according to an embodiment of the present disclosure.

Referring now to FIG. 2 a page buffer, according to an embodiment of the present disclosure, is provided.

The page buffer PB1 of the page buffers PB1 to PBk shown in FIG. 1 is described as an example. It is noted that the remaining page buffers may have the same configuration as page buffer PB1.

Page buffer PB1 may include a clamp circuit 510, a current determination circuit 520, a latch circuit 530, and a bit line coupling unit 540.

The clamp circuit 510 may include a first regulator 511, a PMOS transistor P1, and first to third NMOS transistors N2, N3, and N4. The first regulator 511 may be coupled between the PMOS transistor P1 and a terminal for a core voltage VCORE among internal power supply voltages. The first regulator 511 may be configured, to regulate the core voltage VCORE to a constant potential level in response to a first regulating signal CS_A and output the regulated core voltage. The first regulator 511 may be implemented as a fourth NMOS transistor N5.

The PMOS transistor P1 and the third NMOS transistor N4 may be coupled in series between the first regulator 511 and a control node C_CSO. The PMOS transistor P1 may be turned on in response to a pre-sensing signal PRESEN_N, and the third NMOS transistor N4 may be turned on in response to a control node coupling signal CSOC, for supplying the core voltage VCORE after being regulated by the first regulator 511 to the control node C_CSO. The first and second NMOS transistors N2 and N3 may be coupled in series between the PMOS transistor P1 and the control node C_CSO. A node between the first and second NMOS transistors N2, N3 may be defined as a sensing node C_SEN. The first NMOS transistor N2 may be turned on in response to a first control signal HHO, so that the sensing node C_SEN may be precharged using the core voltage VCORE after being regulated by the first regulator 511. The second NMOS transistor N3 may be turned on in response to a second control signal XXO for electrically connecting the control node C_CSO to the sensing node C_SEN.

The current determination circuit 520 may include a second regulator 521 and first and second PMOS transistors P2 and P3. The second regulator 521 may be coupled between the first PMOS transistor P2 and a terminal for a dawn-converted voltage VDC_PB among the internal power supply voltages. The second regulator 521 may regulate the down-converted voltage VDC_PB to a constant potential level in response to a second regulating signal CS_B and output the regulated down-converted voltage. The second regulator 521 may be implemented as an NMOS transistor N6. The first and second PMOS transistors P2 and P3 may be coupled in series between the second regulator 521 and the first node QS of the latch circuit 530. The first PMOS transistor P2 may be turned on in response to a sensing signal SEN_PMOS, and the second PMOS transistor P3 may adjust the amount of current of the regulated down-converted voltage VDC_PB to be applied to the first node QS in response to the potential level of the sensing node C_SEN.

The latch circuit 530 may include inverters IV1 and IV2 coupled in parallel in opposite directions between the first node QS coupled to the current determination circuit 520 and a second node QS_N. The latch circuit 530 may store data corresponding to the amount of current applied to the first node QS as sensed data.

The bit line coupling unit 540 may be coupled between a bit line BL1 and the control node C_CSO. The bit line may be coupled to a plurality of memory cells. The bit line coupling unit may be configured for electrically connected the bit line BL1 to the control node C_CSO in response to a bit line coupling signal PB_SENSE. The bit line coupling unit 540 may be implemented as an NMOS transistor N1.

A read operation of the page buffer PB1 will now be described.

1) Regulating Operation

The core voltage VCORE and the down-converted voltage VDC_PB may be applied to the page buffer PB1 coupled to the bit line BL1 for performing a read operation. In response to a first regulating signal CS_A, the first regulator 511 in the page buffer PB1 may regulate the core voltage VCORE to a constant potential level having a potential level which is equal to or less than the sum of the minimum value of the core voltage VCORE and a set value for the first regulator 511. In response to the second regulating signal CS_B, the second regulator 521 may regulate the down-converted voltage VDC_PB to a constant potential level having a potential level which is equal to or less than the sum of the minimum value of the down-converted voltage VDC_PB and a set value for the second regulator 521. The set value for the first regulator 511 may be the threshold voltage value of the NMOS transistor N5 constituting the first regulator 511. The set value for the second regulator 521 may be the threshold voltage value of the NMOS transistor N6 constituting the second regulator 521. Hence, the core voltage VCORE, after being regulated by the first regulator 511, may be applied to the clamp circuit 510 in the page buffer PB1. Also, the down-converted voltage VDC_PB, after being regulated by the second regulator 521, may be applied to the current determination circuit 520 in the page buffer PB1.

2) Bit Line Precharge Operation

The bit line coupling unit 540 of the page buffer PB1 may be turned on in response to the bit line coupling signal PB_SENSE and may couple the bit line BL1 to the control node C_CSO. The clamp circuit 510 of the page buffer PB1 may precharge the bit line BL1 to a predetermined level by supplying the core voltage VCORE after having been regulated by the first regulator 511 to the bit line BL1 through the control node C_CSO in response to both a low-level pre-sensing signal PRESEN_N and a high-level control node coupling signal CSOC.

3) Current Sensing Operation

The voltage generation unit 300 may generate and output a read voltage Vread and a pass voltage Vpass required for a read operation. The row decoder 200 may apply the read voltage Vread to a selected word line and the pass voltage Vpass to unselected word lines of a selected memory block in response to the row address RADD.

When the read voltage Vread is applied to the selected word line to which a selected memory cell may be coupled, current flowing through the precharged bit line BL1 may vary depending on the programmed state of the selected memory cell. For example, when the threshold voltage of the selected memory cell is less than the read voltage Vread, a channel is formed in the selected memory cell, thus increasing the amount of current while decreasing the potential level of the bit line BL1. When the threshold voltage of the selected memory cell is greater than the read voltage Vread, a channel s not formed in the selected memory cell, thus preventing current from occurring while maintaining the potential level of the bit line BL1. In this way, depending on the programmed state of the selected memory cell, current flowing through the bit line BL1 may be less than or greater than a first reference current.

When the second control signal XXO is applied and the NMOS transistor N3 is turned on, current flowing through the bit line BL1 may be reflected in the control node C_CSO and the sensing node C_SEN, so that the potential level of the sensing node C_SEN may be maintained in the precharged level or may be discharged to a low level, thus turning on or off the PMOS transistor P3. The latch circuit 530 may latch the sensed data in such a way that, depending on the turning-on or turning-off operation of the PMOS transistor P3, the first node QS may be maintained in an initialized state that is a low level, or transition to a state that is a high level.

Figure 3:
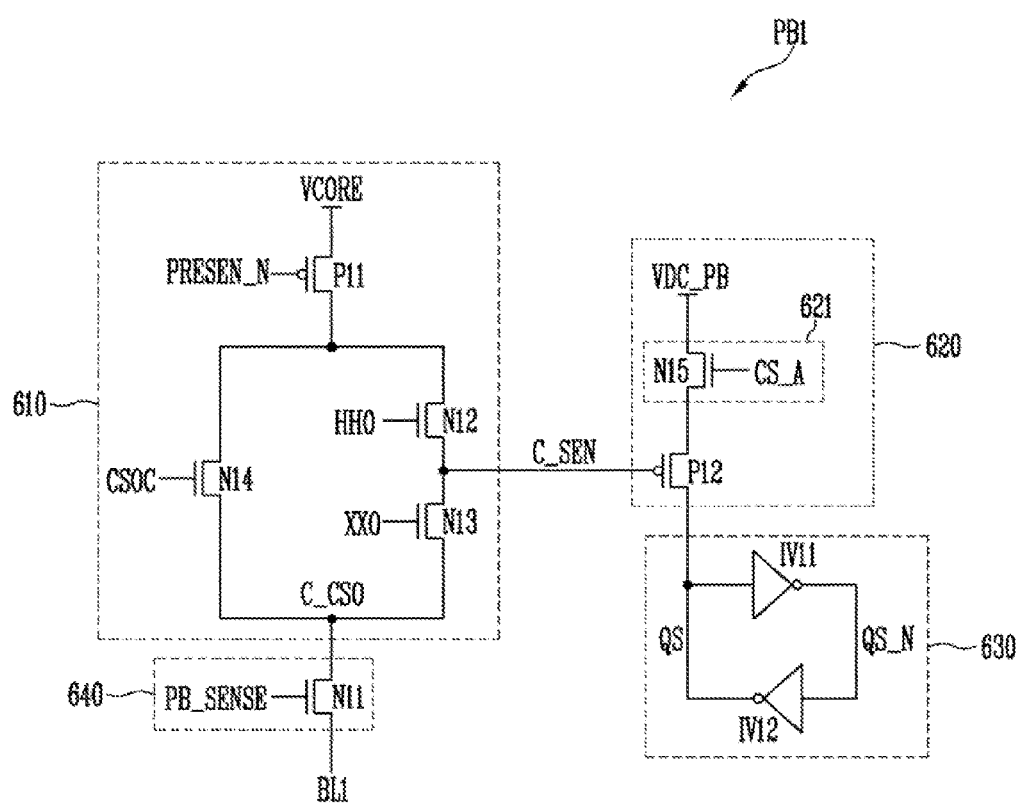
FIG. 3 is a diagram illustrating a page buffer, according to another embodiment of the present disclosure.

FIG. 3 is a diagram illustrating a page, buffer according to another embodiment of the present disclosure.

Referring to FIG. 3, the page buffer PB1 may include a clamp circuit 610, a current determination circuit 620, a latch circuit 630, and a bit line coupling unit 640.

The clamp circuit 610 may include a PMOS transistor P11 and first to third NMOS transistors N12, N13, and N14. The PMOS transistor P11 and the third NMOS transistor N14 may be coupled in series between a terminal for a core voltage VCORE and a control node C_CSO. The PMOS transistor P11 may be turned on in response to a pre-sensing signal PRESEN_N, and the third NMOS transistor N14 may be turned on in response to a control node coupling signal CSOC, for supplying the core voltage VCORE to the control node C_CSO. The first and second NMOS transistors N12 and N13 may be coupled in series between the PMOS transistor P11 and the control node C_CSO. A node between the first NMOS transistor N12 and the second NMOS transistor N13 may be defined as a sensing node C_SEN. The first NMOS transistor N12 may be turned on in response to a first control signal HHO for precharging the sensing node C_SEN using the core voltage VCORE. The second NMOS transistor N13 may be turned on in response to a second control signal XXO for electrically connected the control node C_CSO to the sensing node C_SEN.

The current determination circuit 620 may include a first regulator 621 and a PMOS transistor P12. The first regulator 621 may be coupled between the PMOS transistor P12 and a terminal for a down-converted voltage VDC_PB selected among internal power supply voltages. The first regulator 621 may be configured to regulate the down-converted voltage VDC_PB to a constant potential level in response to a first regulating signal CS_A and output the regulated down-converted voltage. The first regulator 621 may be implemented as an NMOS transistor N15. The PMOS transistor P12 may be coupled between the first regulator 621 and the first node QS of the latch circuit 630. The PMOS transistor P12 may adjust the amount of current of the regulated down-converted voltage VDC_PB to be applied to the first node QS in response to the potential level of the sensing node C_SEN.

The latch circuit 630 may include inverters IV11 and IV12 coupled in parallel in opposite directions between the first node QS coupled to the current determination circuit 620 and a second node QS_N. The latch circuit 630 may store data corresponding to the amount of current applied to the first node QS as sensed data.

The bit line coupling unit 640 may be coupled between a bit line BL1, to which a plurality of memory cells may be coupled, and the control node C_CSO, and may be configured for electrically connecting the bit line BL1 to the control node C_CSO in response to a bit line coupling signal PB_SENSE. The bit line coupling unit 640 may be implemented as an NMOS transistor N11.

A read operation of the page buffer PB1, will be described as follows.

1) Regulating Operation

The core voltage VCORE and the down-converted voltage VDC_PB may be applied to the page buffer PB1 coupled to the bit line BL1 for performing a read operation. In response to the first regulating signal CS, the first regulator 621 in the page buffer PB1 may regulate the down-converted voltage VDC_PB to a constant level A having a potential level, which is equal to or less than the sum of the minimum value of the down-converted voltage VDC_PB and a set value for the first regulator 621. The set value for the first regulator 621 may be the threshold voltage value of the NMOS transistor N15 constituting the first regulator 621.

Accordingly, the down-converted voltage VDC_PB after having been regulated by the first regulator 621 may be applied to the current determination circuit 620 in the page buffer PB1.

2) Bit Line Precharge Operation

The bit line coupling unit 640 of the page buffer PB1 may be turned on in response to the bit line coupling signal PB_SENSE and may be configured for coupling the bit line BL1 to the control node C_CSO. The clamp circuit 610 of the page buffer PB1 may precharge the bit line BL1 to a predetermined level by supplying the core voltage VCORE to the bit line BL1 through the control node C_CSO in response to a low-level pre-sensing signal PRESEN_N and a high-level control node coupling signal CSOC.

3) Current Sensing Operation

The voltage generation unit 300 may generate and output a read voltage Vread and a pass voltage Vpass required for a read operation. The row decoder 200 may apply the read voltage Vread to a selected word line of a selected memory block in response to the row address RADD. The row decoder 200 may also apply the pass voltage Vpass to unselected word lines of a selected memory block in response to the row address RADD.

When the read voltage Vread is applied to the selected word line to which a selected memory cell may be coupled, current flowing through the precharged bit line BL1 may vary depending on the programmed state of the selected memory cell. For example, when the threshold voltage of the selected memory cell is less than the read voltage Vread, a channel may be formed in the selected memory cell, thus increasing the amount of current while decreasing the potential level of the bit line BL1. When the threshold voltage of the selected memory cell is greater than the read voltage Vread, a channel may not be formed in the selected memory cell, thus preventing current from occurring while maintaining the potential level of the bit line BL1. In this way, depending on the programmed state of the selected memory cell, current flowing through the bit line BL1 may be less than or greater than a first reference current.

When the second control signal XXO is applied and the NMOS transistor N13 may be turned on, current flowing through the bit line BL1 may be reflected in the control node C_SO and the sensing node C_SEN, so that the potential level of the sensing node C_SEN may be maintained in the precharged level or may be discharged to a low level, thus turning on or off the PMOS transistor P12. The PMOS transistor P12 responding to the potential level of the sensing node C_SN may adjust the amount of current of the regulated down-converted voltage VDC_PB to be applied to the first node QS.

The latch circuit 630 may latch the sensed data so that, depending on the turning-on or turning-off operation of the PMOS transistor P12 the first node QS may be maintained In an initialized state that is a low level, or makes a transition to a state that is a high level.

Figure 4:
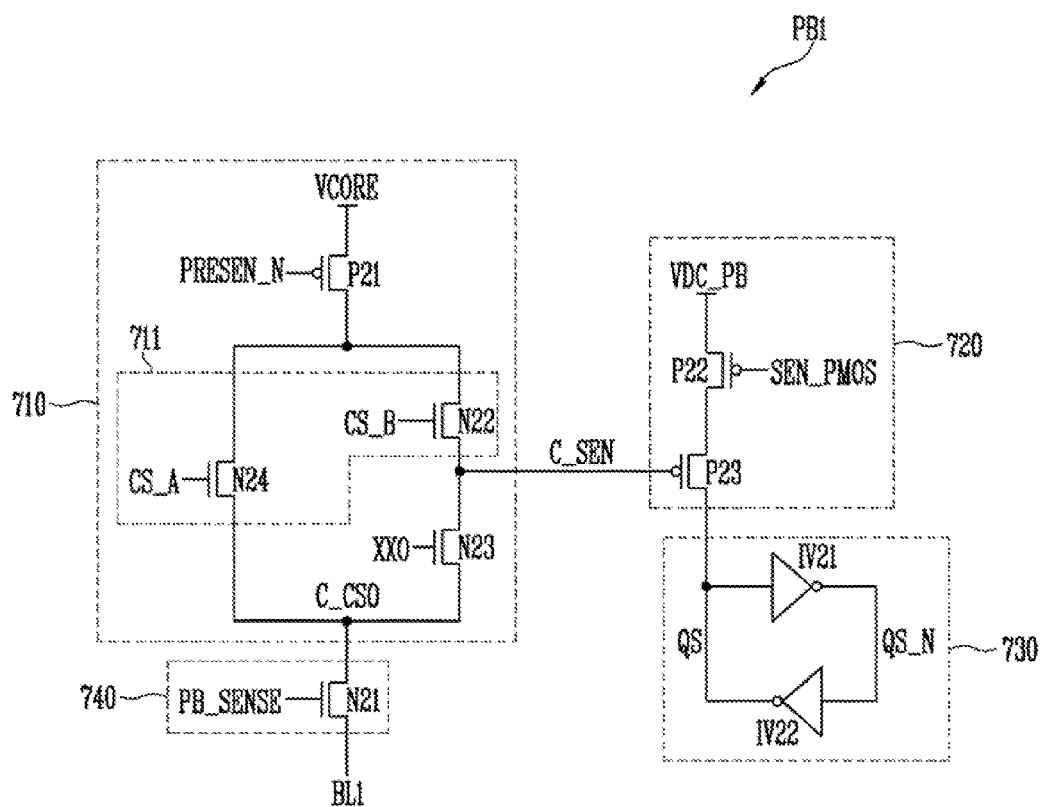
FIG. 4 is a diagram illustrating a page buffer, according to yet another embodiment of the present disclosure.

FIG. 4 is a diagram illustrating a page buffer, according to a further embodiment of the present disclosure.

Referring to FIG. 4, a page buffer PB1 may include a clamp circuit 710, a current determination circuit 720, a latch circuit 730 and a bit line coupling unit 740.

The clamp circuit 710 may include a PMOS transistor P21, a regulating signal supply unit 711, and a first NMOS transistor N23. The PMOS transistor P21 may be coupled between a terminal for a core voltage VCORE and the regulating signal supply unit 711, and may be turned on for supplying the core voltage VCORE to the regulating signal supply unit 711 in response to a pre-sensing signal PRESEN_N.

The regulating signal supply unit 711 may include second and third NMOS transistors N22 and N24. The second NMOS transistor N22 may be coupled between the PMOS transistor P21 and a sensing node C_SEN, and may be turned on to supply the regulated core voltage VCORE to the sensing node C_SEN in response to a second regulating signal CS_B. The third NMOS transistor N24 may be coupled between the PMOS transistor P21 and a control node C_CSO, and may be turned on to supply the regulated core voltage VCORE to the control node C_CSO in response to a first regulating signal CS_A. The first NMOS transistor N23 may be turned on in response to a control signal XXO, thus coupling the sensing node C_SEN between the second NMOS transistor N22 and the first NMOS transistor N23 to the control node C_CSO.

The current determination circuit 720 may include first and second PMOS transistors 22 and P23. The first and second PMOS transistors P22 and P23 may be coupled in series between a terminal for a down-converted voltage VDC_PB and the first node QS of the latch circuit 730. The first PMOS transistor P22 may be turned on in response to a sensing signal SEN_PMOS, and the second PMOS transistor P23 may adjust the amount of current of the down-converted voltage VDC_PB to be applied to the first node QS in response to the potential level of the sensing node C_SEN.

The latch circuit 730 may include inverters IV21 and IV22 coupled in parallel in opposite directions between the first node QS coupled to the current determination circuit 720 and a second node QS_N. The latch circuit 730 may store data corresponding to the amount of current applied to the first node QS as sensed data.

The bit line coupling unit 740 may be coupled between a bit line BL1, to which a plurality of memory cells may be coupled, and the control node C_CSO, and may be configured for electrically connected the bit line BL1 to the control node C_CSO in response to a bit line coupling signal PB_SENSE. The bit line coupling unit 740 may be implemented as an NMOS transistor N21.

The read operation of the page buffer PB1 will be described as follows.

1) Regulating Operation

The core voltage VCORE and the down-converted voltage VDC_PB may be applied to the page buffer PB1 coupled to the bit line BL1 for performing a read operation. In response to the first regulating signal CS_A, the third NMOS transistor N24 in the page buffer PB1 may regulate the core voltage VCORE to a constant level having a potential level, which is equal to or less than the sum of the minimum value of the core voltage VCORE and a set value for the third NMOS transistor N24. The set value for the third NMOS transistor N24 may be the threshold voltage value of the third NMOS transistor N24. In response to the second regulating signal CS_B, the second NMOS transistor N22 may regulate the core voltage VCORE to a constant level having a potential level, which is equal to or less than the sum of the minimum value of the core voltage VCORE and a set value for the second NMOS transistor N22. The set value for the second NMOS transistor N22 may be the threshold voltage value of the second NMOS transistor N22. Accordingly, the core voltage VCORE regulated by the second and third NMOS transistors N22 and N24 of the regulating signal supply unit 711 may be applied to the clamp circuit 710 in the page buffer PB1.

2) Bit Line Precharge Operation

The bit line coupling unit 748 of the page buffer PB1 may be turned on in response to the bit line coupling signal PB_SENSE, and may be configured to couple the bit line BL1 to the control node C_CSO. The clamp circuit 710 of the page buffer PB1 may precharge the bit line BL1 to a predetermined level by supplying the core voltage VCORE regulated by the third NMOS transistor N24 to the bit line BL1 through the control node C_CSO in response to a low-level pre-sensing signal PRESEN_N.

3) Current Sensing Operation

The voltage generation unit 300 may generate and output a read voltage Vread and a pass voltage Vpass required for a read operation. The row decoder 200 may apply the read voltage Vread to a selected word line of a selected memory block in response to the row address RADD. The row decoder 200 may also apply the pass voltage Vpass to unselected word lines of a selected memory block in response to the row address RADD.

When the read voltage Vread is applied to the selected word line to which a selected memory cell may be coupled, current flowing through the precharged bit line BL1 may vary depending on the programmed state of the selected memory cell. For example, when the threshold voltage of the selected memory cell is less than the read voltage Vread, a channel may be formed in the selected memory cell, thus increasing the amount of current while decreasing the potential level of the bit line BL1. When the threshold voltage of the selected memory cell is greater than the read voltage Vread, a channel may not be formed in the selected memory cell, thus preventing current from occurring while maintaining the potential level of the bit line BL1. In this way, depending on the programmed state of the selected memory cell, current flowing through the bit line BL1 may be less than or greater than a first reference current.

When the control signal XXO is applied and the NMOS transistor N23 may be turned on, current flowing through the bit line BL1 may be reflected in the control node C_CSO and the sensing node C_SEN, so that the potential level of the sensing node C_SEN may be maintained in the precharged level or may be discharged to a low level, thus turning on or off the PMOS transistor P23. The latch circuit 730 may latch the sensed data in such a way that, depending on the turning-on or turning-off operation of the PMOS transistor P23, the first node QS may be maintained in an initialized state that is a low level, or makes a transition to a state that is a high level.

Figure 5:
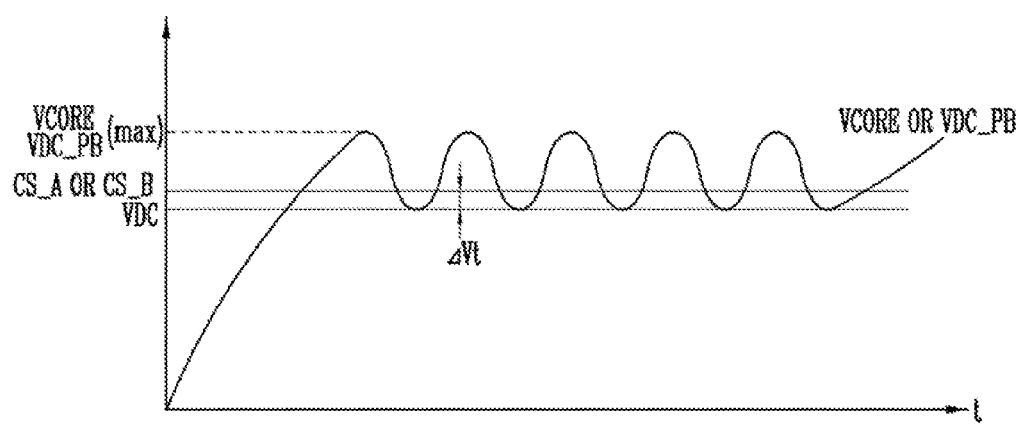
FIG. 5 is a diagram showing potential levels of an internal power supply voltage, a regulating signal supplied to the page buffer and a regulated voltage generated from the page buffer, according to an embodiment of the present disclosure.

FIG. 5 is a diagram showing potential levels of an internal power supply voltage, a regulating signal supplied to the page buffer and a regulated voltage generated from the page buffer, according to an embodiment of the present disclosure.

Referring to FIGS. 2 and 5, the core voltage VCORE and the down-converted voltage VDC_PB applied into the page buffer PB1 may initially rise as time t elapses. Then, when a predetermined time has elapsed, the potential levels of the core voltage VCORE and the down-converted voltage VDC_PB may be increased or decreased while fluctuating between the maximum values and minimum values thereof. The clamp circuit 510 of the page buffer PB1 may include the first regulator 511 for supplying a constant core voltage VCORE. The first regulating signal CS_A having a potential level equal to or less than the sum of the minimum value of the core voltage VCORE and the set value for the first regulator 511, may be applied to the first regulator 511. Further, the current determination circuit 520 may include the second regulator 521 to supply a constant down-converted voltage VDC_PB. The second regulating signal CS_B having a potential level equal to or less than the sum of the minimum value of the down-converted voltage VDC_PB and the set value for the second regulator 521, may be applied to the second regulator 521. Therefore, the core voltage VCORE and the down-converted voltage VDC_PB which have passed through the first regulator 511 and the second regulator 521, respectively, may be regulated so that a DC voltage VDC having a constant potential level may be outputted using the minimum values of the core voltage VCORE and the down-converted voltage VDC_PB.

Figure 6:
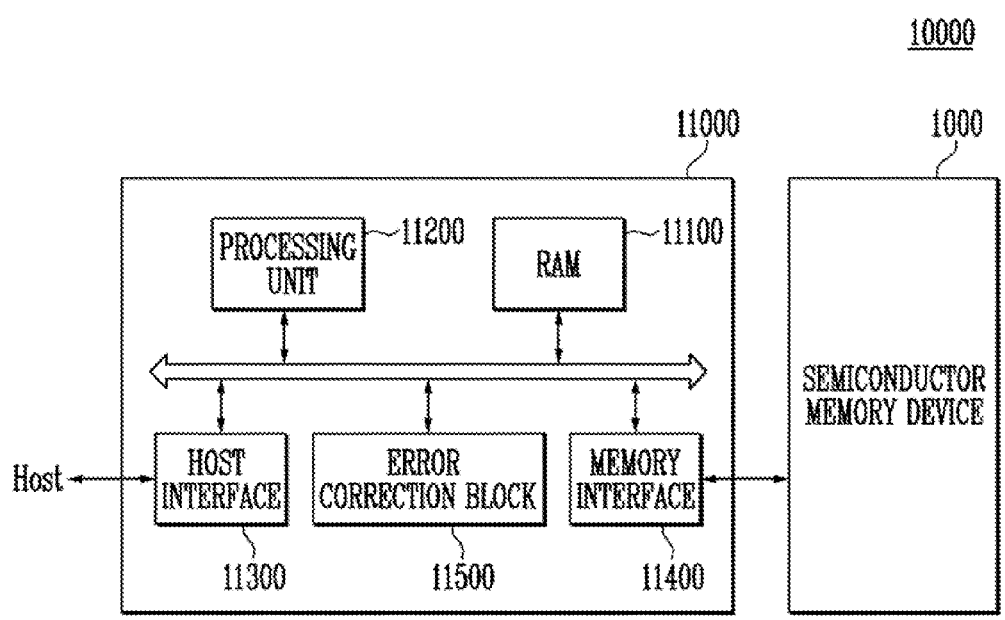
FIG. 6 is a block diagram showing a memory system including the semiconductor memory device of FIG. 1, according to an embodiment of the present disclosure.

Referring to FIG. 6 a memory system 10000 including the semiconductor memory device 1000 of FIG. 1, is provided according to an embodiment of the present disclosure.

The memory system 10000 may further include controller 11000.

Since the semiconductor memory device 1000 is the same as the semiconductor device 1000 described with reference to FIG. 1, hereinafter, repetitive description thereof will be omitted.

The controller 11000 may be coupled to a host and the semiconductor memory device 1000. In response to a request from the host, the controller 11000 may access the semiconductor memory device 1000. For example, the controller 11000 may be configured to control the read, write, erase, and background operations of the semiconductor memory device 1000. The controller 11000 may be configured to provide an interface between the Host and the semiconductor memory device 1000.

The controller 11000 may be configured to run firmware for controlling the semiconductor memory device 1000. The controller 11000 may include a RAM 11100, a processing unit 11200, a host interface 11300, a memory interface 11400, and an error correction block 11500. The RAM 11100 may be used as an operation memory of the processing unit 11200, a cache memory between the semiconductor memory device 1000 and the host, and/or a buffer memory between the semiconductor memory device 1000 and the host. The processing unit 11200 may control an entire operation of the controller 11000. In addition, the controller 11000 may temporarily store program data provided from the host during a write operation.

The host interface 11300 may include a protocol for performing data exchange between the host and controller 11000. As an exemplary embodiment, the controller 11000 may communicate with the host through one or more various interface protocols including a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 11400 may provide interfacing with the semiconductor memory device 1000. For example, the memory interface 11400 may include a NAND or a NOR flash interface.

The error correction block 11500 may be configured to detect and correct an error in data received from the semiconductor memory device 1000 by using an error correction code (ECC). The processing unit 11200 may adjust the read voltage based on an error detection result from the error correction block 11500, and control the semiconductor memory device 1000 to perform re-reading. As an exemplary embodiment the error correction block may be provided as an element of the controller 11000.

The controller 11000 and the semiconductor memory device 1000 may be integrated into a single semiconductor device. As an exemplary embodiment, the controller 11000 and the semiconductor memory device 1000 may be integrated into a single semiconductor device to form a memory card, such as a PC card (e.g. personal computer memory card international association: PCMCIA), a compact flash card (CF), a smart media card (SMC), a memory stick, a multimedia card (MMC, RS-MMC, or MMCmicro), an SD card (SD, miniSD, microSD, or SDHC), universal flash storage (UFS) or the like.

The controller 11000 and the semiconductor memory device 1000 may be integrated into a single semiconductor device to constitute a solid state drive (SSD). The SSD may include a storage device configured to store data in a semiconductor memory. When the memory system 10000 is used as the SSD, an operation speed of the host coupled to the memory system 10000 may be substantially improved.

As another example, the memory system 10000 may be provided as one of various elements of an electronic device including a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, a radio frequency identification (RFID) device, a device for a home, computer, or telematics network or a computing system, or the like.

As an exemplary embodiment, the semiconductor memory device 1000 or the memory system 10000 may be embedded in various types of packages. For example, the semiconductor memory device 1000 or the memory system 10000 may be packaged and embedded through various packing techniques, such as package on package (PoP), ball grid array (BGA), chip scale package (CSP) plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC) shrink small outline package (SSOP), thin small outline package (TSOP), system in package (SIP), multi-chip package (MCP), wafer-level fabricated package (WFP), wafer-level processed stack package (WSP), or the like.

Figure 7:
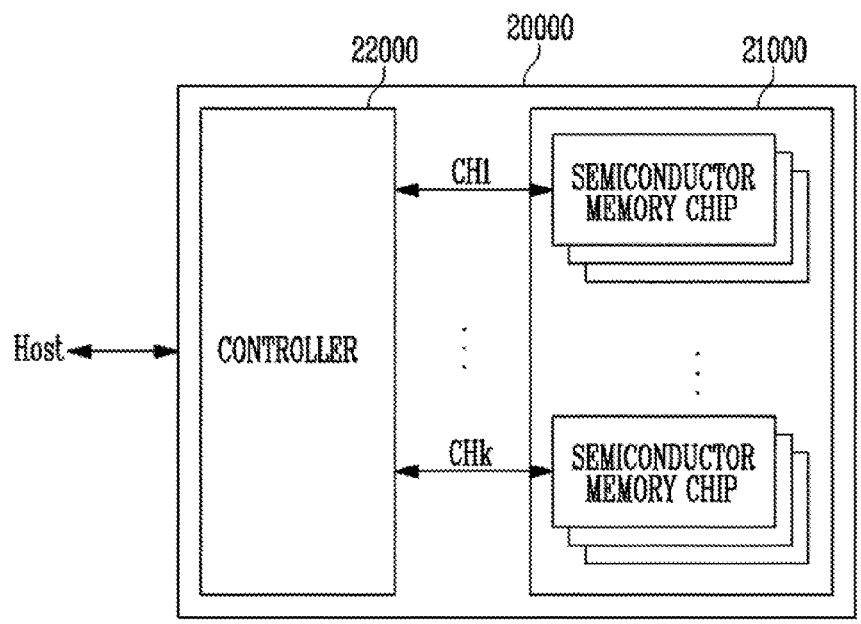
FIG. 7 is a block diagram showing an application example of the memory system of FIG. 6.

FIG. 7 is a block diagram showing an application example of the memory system of FIG. 6.

Referring FIG. 7, a memory system 20000 may include the semiconductor memory device 21000 and a controller 22000. The semiconductor memory device 21000 may include a plurality of semiconductor memory chips. The plurality of semiconductor memory chips may be divided into a plurality of groups.

In FIG. 7, it is illustrated that the plurality of groups of the semiconductor memory chips may communicate with the controller 22000 through first to k-th channels CH1 to CHk, respectively. Each group may be configured to communicate with the controller 22000 through one common channel. The controller 22000 may be configured identically to the controller 11000 described with reference to FIG. 6 and controls the plurality of semiconductor memory chips of the semiconductor memory device 21000 through the plurality of channels CH1 to CHk.

Figure 8:
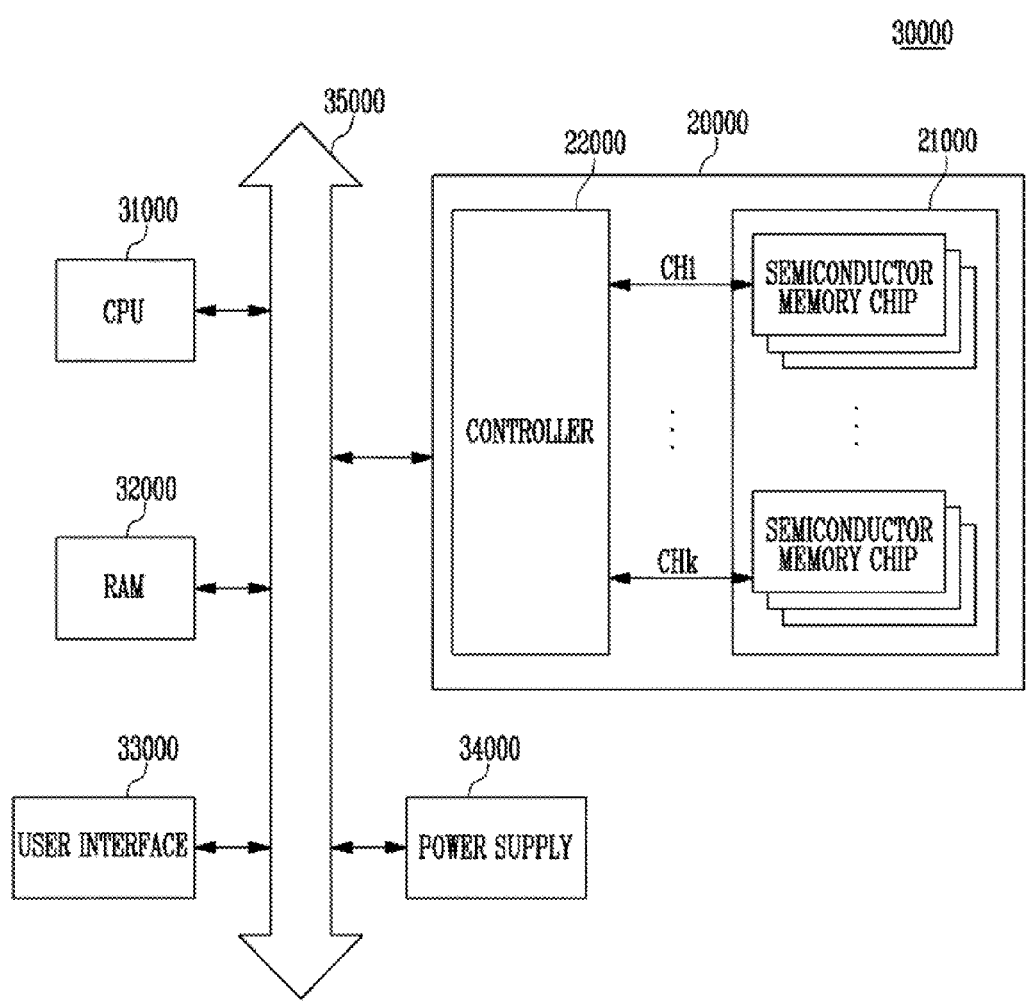
FIG. 8 is a block diagram showing a computing system including the memory system described with reference to FIG. 7.

FIG. 8 is a block diagram illustrating a computing system including the memory system described with reference to FIG. 7.

Referring to FIG. 8, a computing system 30000 may include a central processing unit (CPU) 31000, a RAM 32000, a user interface 33000, a power supply 34000, a system bus 35000, and a memory system 20000.

The memory system 20000 may be electrically connected to the CPU 31000, the RAM 32000, the user interface 33000, and the power supply 34000 through the system bus 35000. Data provided through the user interface 33000 or processed by the CPU 31000 may be stored in the memory system 20000. In FIG. 8, the semiconductor memory device 21000 is illustrated to be coupled to the system bus 35000 through the controller 22000. However, the semiconductor memory device 21000 may be directly coupled to the system bus 35000. At this point, a function of the controller 22000 may be performed by the CPU 31000 and the RAM 32000.

In FIG. 8, the computing system 30000 may include the memory system 20000 described with reference to FIG. 7. However, the memory system 20000 may be replaced with the memory system 10000 described with reference to FIG. 6. As an exemplary embodiment, the computing system 30000 may include both the memory systems 10000 and 20000 described with reference to FIGS. 6 and 7.

In accordance with embodiments of the present disclosure, the page buffer may regulate internal power supply voltages supplied thereto to a constant level, thus stably performing an operation thereof.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array including a plurality of memory cells; and
a plurality of page buffers respectively coupled to a plurality of bit lines of the memory cell array, the page buffers being supplied with internal voltages to precharge the plurality of bit lines or to sense an amount of current flowing through the plurality of bit lines, during a sensing operation,
wherein each of the page buffers comprises a current determination circuit,
the current determination circuit suitable for regulating a down converting voltage of the internal voltages to an internal down converting voltage having a constant potential level and performs an operation for sensing the amount of current by using an regulated internal down converting voltage during the sensing operation.

2. The semiconductor memory device according to claim 1, wherein each of the page buffers comprises:
a clamp circuit suitable for precharging a corresponding bit line of the plurality of bit lines and a sensing node using a core voltage among the internal voltages, and for adjusting a potential level of the sensing node depending on an amount of current of the corresponding bit line; and
the current determination circuit suitable for adjusting an amount of output current in response to the potential level of the sensing node in the clamp circuit.

3. The semiconductor memory device according to claim 2, wherein the clamp circuit comprises:
a first regulator suitable for regulating the core voltage to an internal core voltage having a first constant potential level in response to a first regulating signal;
a first switching unit suitable for precharging the bit line using the internal core voltage;
a second switching unit suitable for precharging the sensing node using the internal core voltage; and
a third switching unit suitable for coupling the bit line to the sensing node.

4. The semiconductor memory device according to claim 3, wherein the first regulating signal has a first potential level that is equal to or less than a sum of a minimum value of the core voltage and a set value for the first regulator.

5. The semiconductor memory device according to claim 2, wherein the current determination circuit comprises:
a second regulator suitable for regulating the down-converted voltage to the internal down-converted voltage having a second constant potential level in response to a second regulating signal; and
a fourth switching unit suitable for adjusting and outputting an amount of current of the internal down-converted voltage in response to the potential level of the sensing node.

6. The semiconductor memory device according to claim 5, wherein the second regulating signal has a second potential level that is equal to or less than a sum of a minimum value of the down-converted voltage and a set value for the second regulator.

7. A page buffer, comprising:
a bit line coupling unit coupled between a bit line to which a plurality of memory cells coupled and a control node, the bit line coupling unit being suitable for electrically coupling the bit line to the control node in response to a bit line coupling signal;
a clamp circuit supplied with a first internal voltage to precharge the bit line and a sensing node, the clamp circuit being suitable for adjusting a potential level of the sensing node depending on an amount of current of the bit line;
a current determination circuit suitable for generating a supply voltage by regulating a second internal voltage to a constant level and adjusting an amount of current output by using an regulated supply voltage in response to the sensing node potential level in the clamp circuit during a sensing operation; and
a latch circuit suitable for storing data corresponding to the amount of current adjusted by the current determination circuit.

8. The page buffer according to claim 7, wherein the clamp circuit comprises:
a first switching unit suitable for precharging the bit line using the first internal voltage;
a second switching unit suitable for precharging the sensing node using the first internal voltage; and
a third switching unit suitable for coupling the bit line to the sensing node.

9. The page buffer according to claim 7, wherein the current determination circuit comprises:
a first regulator suitable for regulating the second internal voltage to the supply voltage having the constant potential level in response to a first regulating signal; and
a fourth switching unit suitable for adjusting and outputting an amount of current of the supply voltage in response to the potential level of the sensing node.

10. The page buffer according to claim 9, wherein the first regulating signal has a potential level that is equal to or less than a sum of a minimum value of the second internal voltage and a set value for the first regulator.

* * * * *